United States Patent
Han et al.

(10) Patent No.: US 9,035,394 B2
(45) Date of Patent: *May 19, 2015

(54) SEMICONDUCTOR DEVICE

(71) Applicant: SAMSUNG ELECTRONICS CO., LTD., Suwon-Si, Gyeonggi-Do (KR)

(72) Inventors: Seung-Uk Han, Suwon-Si (KR); Nam-Ho Jeon, Hwaseong-Si (KR)

(73) Assignee: SAMSUNG ELECTRONICS CO.. LTD., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/146,919

(22) Filed: Jan. 3, 2014

(65) Prior Publication Data

US 2014/0117460 A1    May 1, 2014

Related U.S. Application Data

(63) Continuation of application No. 13/570,491, filed on Aug. 9, 2012, now Pat. No. 8,648,402.

(30) Foreign Application Priority Data

Aug. 10, 2011    (KR) .................. 10-2011-0079718

(51) Int. Cl.
*H01L 21/02*    (2006.01)
*H01L 27/088*    (2006.01)
(Continued)

(52) U.S. Cl.
CPC .. *H01L 29/42376* (2013.01); *H01L 21/823456* (2013.01); *H01L 27/088* (2013.01)

(58) Field of Classification Search
CPC .................. H01L 21/823456; H01L 21/82385; H01L 27/0207; H01L 27/088; H01L 29/42372; H01L 29/4238; H01L 29/42376

USPC .................. 257/288, 296, 368, 382, E23.151, 257/E23.152, E27.06

See application file for complete search history.

(56) References Cited

U.S. PATENT DOCUMENTS 5,982,008 A * 11/1999 Kajiyama ...................... 257/401
7,190,011 B2 * 3/2007 Aizawa et al. ................. 257/288
(Continued)

FOREIGN PATENT DOCUMENTS

| | | |
|---|---|---|
| JP | 05-335563 | 12/1993 |
| JP | 07-066397 | 3/1995 |
| JP | 2007-059565 | 3/2007 |

OTHER PUBLICATIONS

Machine translation for JP 07-066397 from PAJ retrieved Mar. 23, 2014.*

*Primary Examiner* — Chuong A Luu
*Assistant Examiner* — Cory Eskridge
(74) *Attorney, Agent, or Firm* — Volentine & Whitt, PLLC

(57)    ABSTRACT

A semiconductor device includes an active region defined by a device isolation layer and including first and second sections or regions, a gate electrode extending in a first direction across the active region over a channel between the first region and the second region and including at least one first gate tab protruding in a second direction toward the first region, and first and second contact plugs. The first gate tab covers and extends along a boundary between the active region and the device isolation layer. The first contact plug is disposed over the first region, the second contact plug is disposed over the second region, and the second contact plug has an effective width, as measured in the first direction, greater than that of the first contact plug.

6 Claims, 12 Drawing Sheets

(51) Int. Cl.
*H01L 29/94* (2006.01)
*H01L 21/70* (2006.01)
*H01L 29/423* (2006.01)
*H01L 21/8234* (2006.01)

(56) References Cited

U.S. PATENT DOCUMENTS

| | | | |
|---|---|---|---|
| 7,432,143 B2 * | 10/2008 | Cho et al. | 438/176 |
| 7,812,453 B2 * | 10/2010 | Kiyota | 257/758 |
| 7,842,981 B2 * | 11/2010 | Lee et al. | 257/249 |
| 8,187,931 B2 * | 5/2012 | Kim | 438/221 |
| 8,264,022 B2 * | 9/2012 | Yoon et al. | 257/295 |
| 8,648,402 B2 * | 2/2014 | Han et al. | 257/296 |
| 2002/0000618 A1 * | 1/2002 | Saito et al. | 257/368 |
| 2003/0107094 A1 * | 6/2003 | Kim et al. | 257/401 |
| 2009/0026547 A1 * | 1/2009 | Lee et al. | 257/368 |
| 2011/0049635 A1 * | 3/2011 | Carlson | 257/368 |
| 2012/0001271 A1 * | 1/2012 | Chae et al. | 257/401 |
| 2012/0217559 A1 * | 8/2012 | Kim et al. | 257/296 |

* cited by examiner

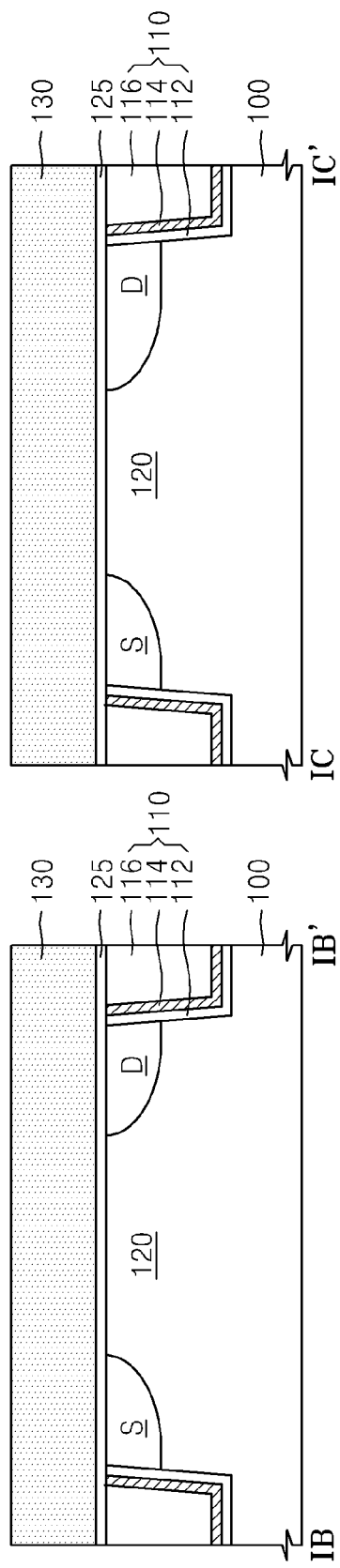

US 9,035,394 B2

SEMICONDUCTOR DEVICE

CROSS-REFERENCE TO RELATED APPLICATIONS

This is a Continuation of U.S. Non-Provisional application Ser. No. 13/570,491, filed on Aug. 9, 2012, which claims the benefit of Korean Patent Application No. 10-2011-0079718, filed on Aug. 10, 2010, in the Korean Intellectual Property Office, the disclosure of which is incorporated by reference herein in its entirety.

BACKGROUND

The inventive concept relates to semiconductor devices. More particularly, the inventive concept relates to a semiconductor device including a transistor, and contact plugs extending on source and drain regions of the transistor, respectively.

Semiconductor devices used in computers, mobile equipment, and the like are becoming more highly integrated to meet the demand for more compact electronic devices and devices that are more multi-functional, for example. To produce semiconductor devices that are more highly integrated, the design rules for components of the semiconductor devices have been reduced. In particular, with regard to a semiconductor device composed of many transistors, the design rule for the gate length of the transistors is constantly being decreased.

However, during the operation of a particular type of transistor, namely a p-type metal-oxide semiconductor (PMOS) transistor, electrons generated by holes, which are charge carriers, are trapped in a device isolation region and a gate insulating layer adjacent to a channel of the transistor. This can reduce the effective length (or width depending on nomenclature used) of the channel. In the case in which the channel length is already small due to a small design rule for the gate length, the phenomena known as hot electron induced punchthrough (HEIP) is likely to occur.

SUMMARY

According to an aspect of the inventive concept, there is provided a semiconductor device comprising a substrate, a device isolation layer of electrically insulating material disposed at an upper portion of the substrate and delimiting an active region of the substrate, a gate electrode extending across the active region such that a first section of the active region lies to one side of the gate electrode and a second section of the active region lies to the other side of the gate electrode, a first electrically conductive contact plug disposed on the first section of the active region, and a second electrically conductive contact plug disposed on the second section of the active region, and in which the gate electrode has a linear main section extending longitudinally across the active region in a first direction, and at least one first gate tab protruding from the linear main section in a second direction toward the first section of the active region, in which the first gate tab covers a boundary between the active region and the device isolation layer, and in which the first contact plug spans a first width of the active region in the first direction, the second contact plug spans a second width of the second section of the active region in the first direction, and the second width is greater than the first width.

According to another aspect of the inventive concept, there is provided a semiconductor device comprising a substrate, a device isolation layer of electrically insulating material disposed at an upper portion of the substrate and delimiting an active region of the substrate, a gate electrode extending over the active region such that a first section of the active region lies to one side of the gate electrode and a second section of the active region lies to the other side of the gate electrode, and contact plugs disposed on the first and second regions, respectively, and in which the gate electrode has a linear main section and at least one first gate tab protruding from the linear main section over a peripheral edge of the active region, and in which the cross-sectional area of the contact plug disposed on the first section of the active region, as taken in a plane parallel to an upper surface of the substrate, is larger than that of the contact plug disposed on the second section of the active region.

According to still another aspect of the inventive concept, there is provided a semiconductor device comprising a substrate, a device isolation layer of electrically insulating material disposed at an upper portion of the substrate and delimiting at least one active region that includes a source region and a drain region, at least one electrode disposed on the substrate and constituting at least one gate electrode, an interlayer insulating layer disposed on the substrate and covering the at least one active region and the device isolation layer, at least one first electrically conductive contact plug extending through the interlayer insulating layer and each of which extends upright on a respective one of said one of the source and drain regions, and at least one second electrically conductive contact plug extending through the insulating layer, and each said second contact plug extending upright on a respective one of the other of said source and drain regions, and in which each gate electrode has a linear main section extending longitudinally across the at least one active region in a first direction, and at least one first gate tab protruding from one side of the linear main section in a second direction over and along a boundary between an active region and the device isolation layer, in which each first gate tab is disposed adjacent one of the source and drain regions, and in which the linear main section of each gate electrode extends between the first and second contact plugs of at least one respective pair thereof, and the second contact plug of the pair is larger than the first.

BRIEF DESCRIPTION OF THE DRAWINGS

The inventive concept will be more clearly understood from the following detailed description of the preferred embodiments thereof taken in conjunction with the accompanying drawings in which:

FIG. 7A to 7C are cross-sectional views of intermediate structures of a semiconductor device and together illustrate a method of manufacturing the semiconductor device according to the inventive concept, wherein each of FIGS. 7A to 7C shows sections of an intermediate structure in directions corresponding to the directions of lines 1B-1B' and 1C-1C' of FIG. 1A, respectively;

DETAILED DESCRIPTION OF THE PREFERRED EMBODIMENTS

Figure 1A:
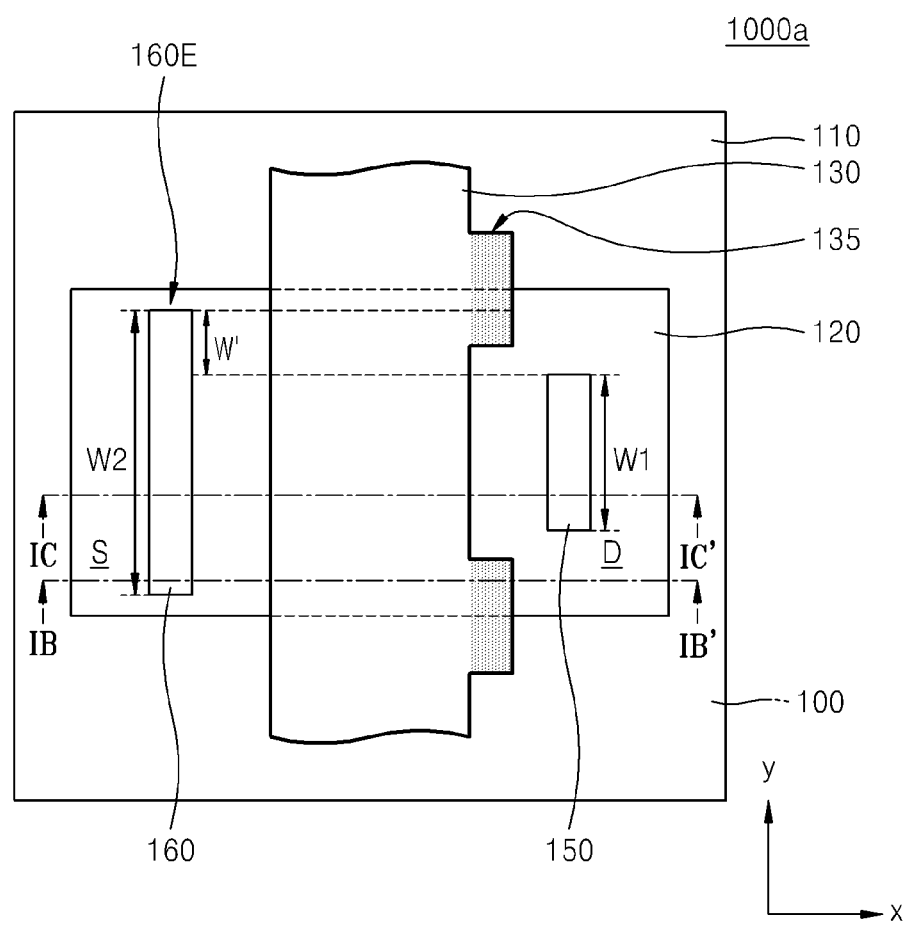
FIG. 1A is a schematic diagram of the layout of a semiconductor device according to the inventive concept.

Various embodiments and examples of embodiments of the inventive concept will be described more fully hereinafter with reference to the accompanying drawings. In the drawings, the sizes and relative sizes and shapes of elements and layers shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Other terminology used herein for the purpose of describing particular examples or embodiments of the inventive concept is to be taken in context. For example, the term "comprises" or "comprising" when used in this specification specifies the presence of stated features or processes but does not preclude the presence or additional features or processes. Also, the term "layer" may be used to denote both a contiguous or non-contiguous structure that consists of a single layer of material or a laminate of materials that together serve some basic function such as an insulating function in the device. The term "larger" as viewed in context will generally refer to total surface area or cross-sectional area in the principal plain of the device.

An embodiment of a semiconductor device 1000a according to the inventive concept will now be described with reference to FIGS. 1A to 1C. The semiconductor device 1000a may constitute a unit structure of a memory such as a flash memory or a dynamic random access memory (DRAM).

The semiconductor device 1000a has a substrate 100, and an active region 120 defined by a device isolation structure 110 in the substrate 100. For example, the active region 120 has an island shape as delimited by the device isolation structure 110.

The substrate 100 may be a bulk wafer or may be constituted by an epitaxial layer. In any case, the substrate 100 comprises a semiconductor, for example, a group IV semiconductor material, a group III-V semiconductor compound or a group II-VI semiconductor oxide. In the case of group IV semiconductor material, the substrate 100 may be a silicon, germanium or silicon-germanium substrate. Also, the semiconductor device 1000a may include a well region (not shown) of impurities in the substrate 100.

The device isolation structure 110 may be a shallow trench isolation (STI) structure. In the illustrated example, the device isolation structure 110 includes a first insulating layer 112, a trench liner 114, and a second insulating layer 116 that are sequentially formed in a trench. The first insulating layer 112, the trench liner 114, and the second insulating layer 116 each may be formed of an oxide, nitride, or a combination thereof. For example, the first insulating layer 112 may be a buffer oxide layer, and the trench liner 114 may comprise a nitride. Also, the second insulating layer 116 may include at least one material selected from the group consisting of TOnen SilaZene (TOSZ), a high temperature oxide (HTO), a high density plasma (HDP) material, tetra ethyl ortho silicate (TEOS), boron-phosphorus silicate glass (BPSG), and undoped silicate glass (USG).

The semiconductor device 1000a also includes a gate electrode 130 which extends longitudinally across the active region 120 (in the direction of the y-axis in FIG. 1A) and onto the device isolation layer 110.

Thus, the active region 120 is basically divided into a first or drain region D of the semiconductor device 1000a at one side of the gate electrode 130, and a second or source region S at the other side of the gate electrode 130. The first region D and the second region S may be formed in the active region 120 of the substrate 100 by doping the substrate 100 with impurities. In this case, the impurities may be selected from the group consisting of boron (B), aluminum (Al), gallium (Ga), and zinc (Zn) which are p-type impurities. Alternatively, the impurities may include be selected from the group consisting of phosphorus (P), arsenic (As), and antimony (Sb) which are n-type impurities.

The gate electrode 130 also has a plurality of first gate tabs 135 protruding toward the first region D. The first gate tabs 135 are shown by shading in FIG. 1A. More specifically, the gate electrode 130 has a linear main section (unshaded in FIG. 1A), and first gate tabs 135 each protruding from the main section a predetermined distance toward the first region D so as to cover a boundary between the active region 120 and the device isolation structure 110. Thus, each gate electrode 130 is asymmetrical about its longitudinal axis (parallel to the y-axis in FIG. 1A). Note, for purposes of discussion, the dimensions of a component such as the first gate tab 135 in the direction of the x-axis will be referred to as the length or depth of the component, and the dimension of the component in the direction of the y-axis direction will be referred to as the width of the component.

The gate electrode 130 may comprise polysilicon, a metal silicide, or a metal such as tungsten (W). The gate electrode 130 may consist of a single layer of conductive material or may be a multi-layered structure. Also, a gate insulating layer 125 may be interposed between the gate electrode 130 and the active region 120. In this case, the gate insulating layer 125 may be of silicon oxide, for example. In addition, spacers 127 may be respectively disposed on lateral surfaces of the gate electrode 130. Such spacers 137 may comprise silicon nitride or silicon oxide.

The semiconductor device 1000a also includes an interlayer insulating layer 140 disposed on the substrate 100, and first and second contact plugs 150 and 160 extending through the interlayer insulating layer 140. The first contact plug 150 and the second contact plug 160 are provided to respectively apply voltages to the first region D and the second region S in order to operate the semiconductor device 1000a. Upper portions of the first contact plug 150 and the second contact plug 160 may be connected to a wiring line (not shown). The gate electrode 130 may also be connected to a wiring line via a separate plug (in a region that is not shown in the figures).

In this example, the first contact plug 150 and the second contact plug 160 are respectively disposed on the first region D and the second region S. Also, the first contact plug 150 and the second contact plug 160 are asymmetric with respect to each other about a line parallel to the direction of the y-axis and extending midway between the contact plugs.

Furthermore, the width W2 of the second contact plug 160 is greater than the width W1 of the first contact plug 150, and the second contact plug 160 extends further, at one end 160E thereof, than the first contact plug 150 toward an edge of the active region 120 by a predetermined distance W'. The distance W' is such that at least part of one end 160E of the second contact plug 160 is laterally juxtaposed, i.e., is juxtaposed in the direction of the x-axis, with at least part of the first gate tap 135. That is, the one end 160E of the second contact plug 160 and the first gate tap 135 overlap as viewed in the direction of the x-axis.

The first contact plug 150 may be disposed between two gate tabs 135 in the direction of the y-axis. That is, the first contact plug 150 may be located between regions occupied by adjacent ones of the first gate tabs 135 if the gates tabs 135 were extended in the direction of the x-axis.

The active region 120 below the gate electrode 130 forms a channel region of the semiconductor device 1000a. Hot holes accelerated in the channel region may generate hot electrons by impact ionization in a depletion region of the first region D. If the first gate tabs 135 were not provided, the generated hot electrons would be trapped in the gate insulating layer 125 or the device isolation layer 110 that is adjacent to the first region D thereby in effect reducing the channel length. In this case, hot electron induced punchthrough (HEIP) could occur, resulting in leakage current along an interface of the active region 120 especially when the device is in an off-state.

In this embodiment of a semiconductor device 1000a according to the inventive concept, the first gate tabs 135 prevent electrons from being trapped in the device isolation structure 110 or the gate insulating layer 125 during an operation of the semiconductor device 1000a, thereby reducing the likelihood that HEIP will occur. Also, the second contact plug 160 disposed on the second region S may be sized to maximize the amount of on-current, thereby enhancing the performance of the semiconductor device 1000a.

Figure 1B:
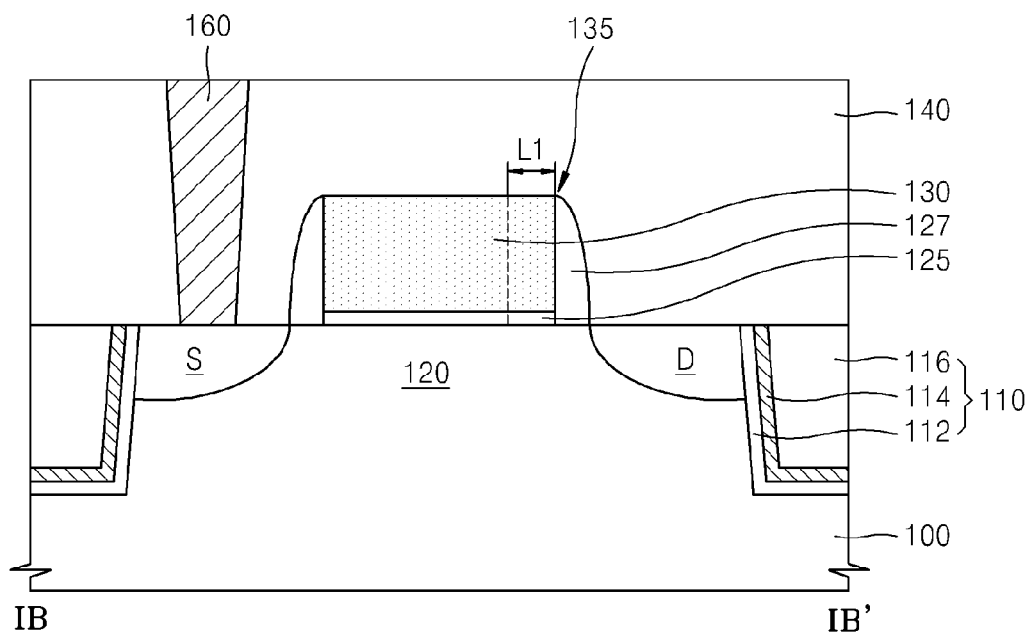
FIGS. 1B and 1C are cross-sectional views of the semiconductor device as taken along lines Ib-Ib' and IC-IC' of FIG. 1A, respectively.
Figure 1C:
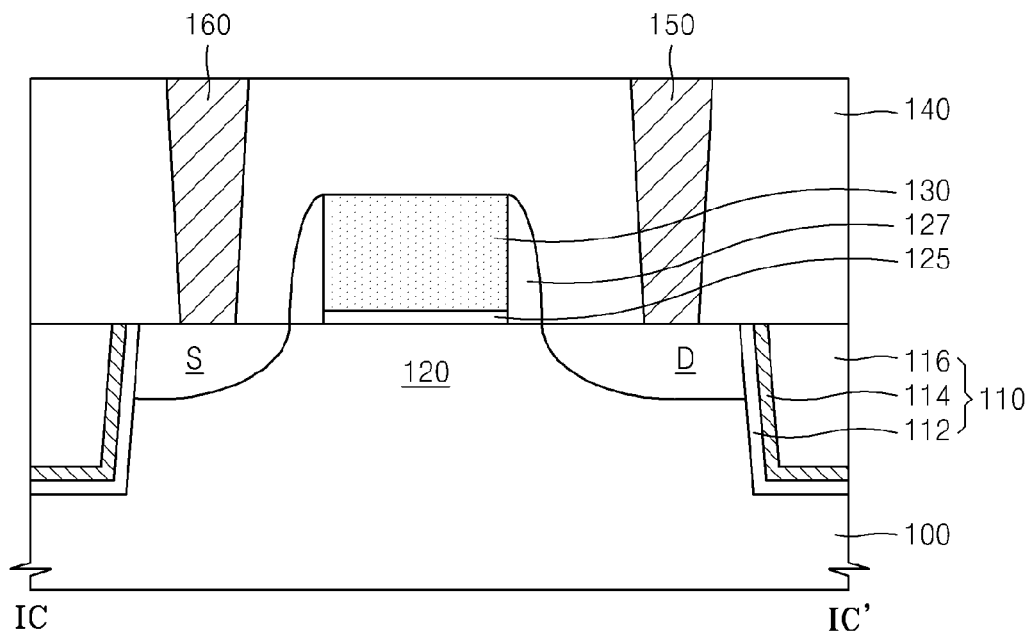
Figure 2:
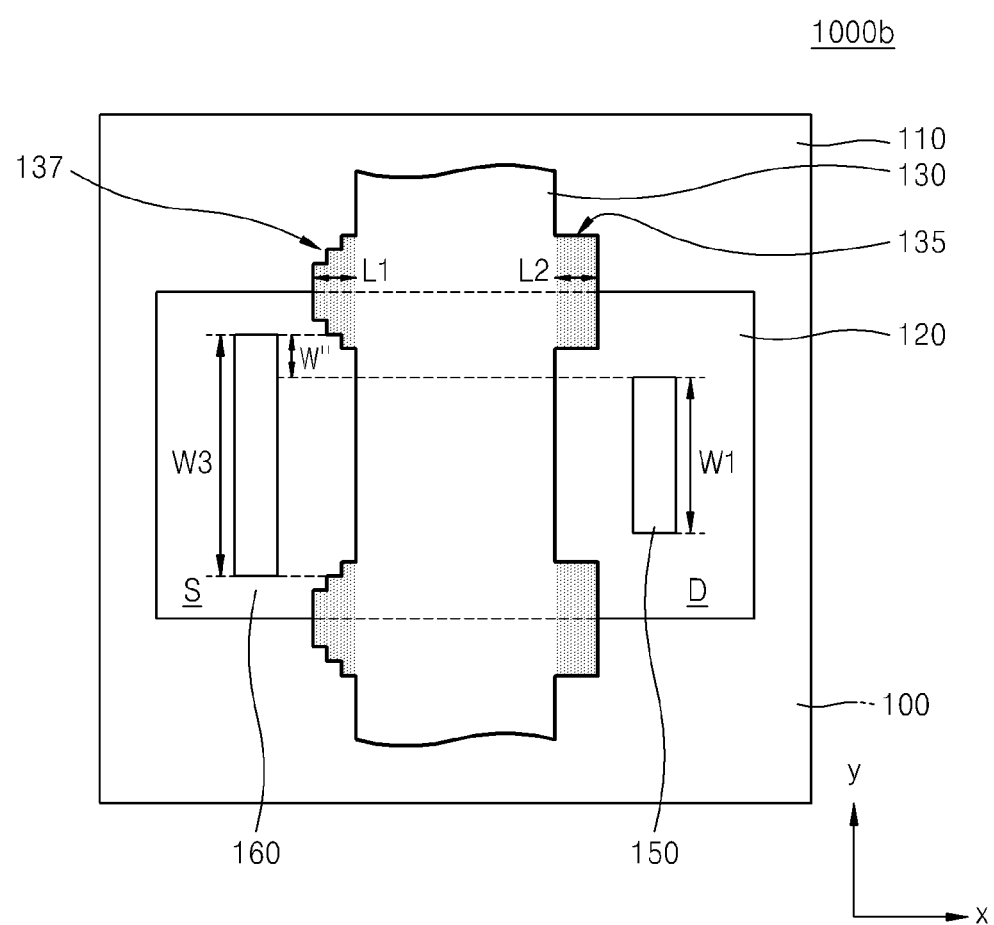
FIGS. 2 to 4 are schematic diagrams of other examples, respectively, of layouts of a semiconductor device according to the inventive concept.
Figure 3:
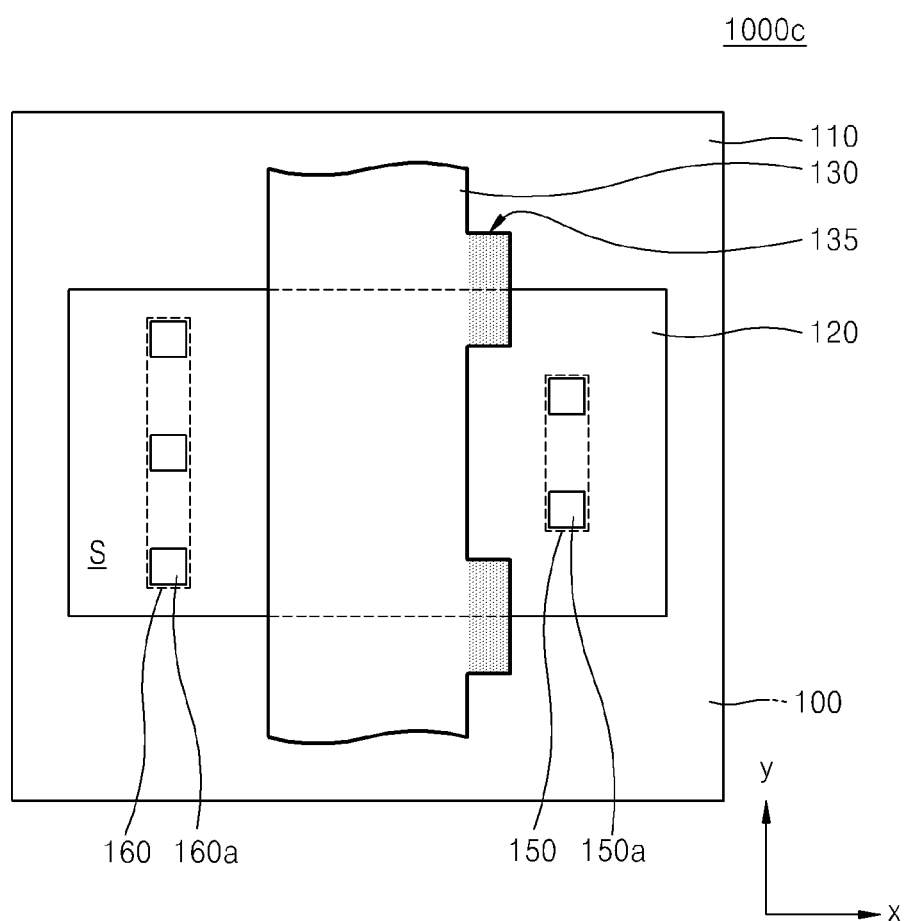
Figure 4:
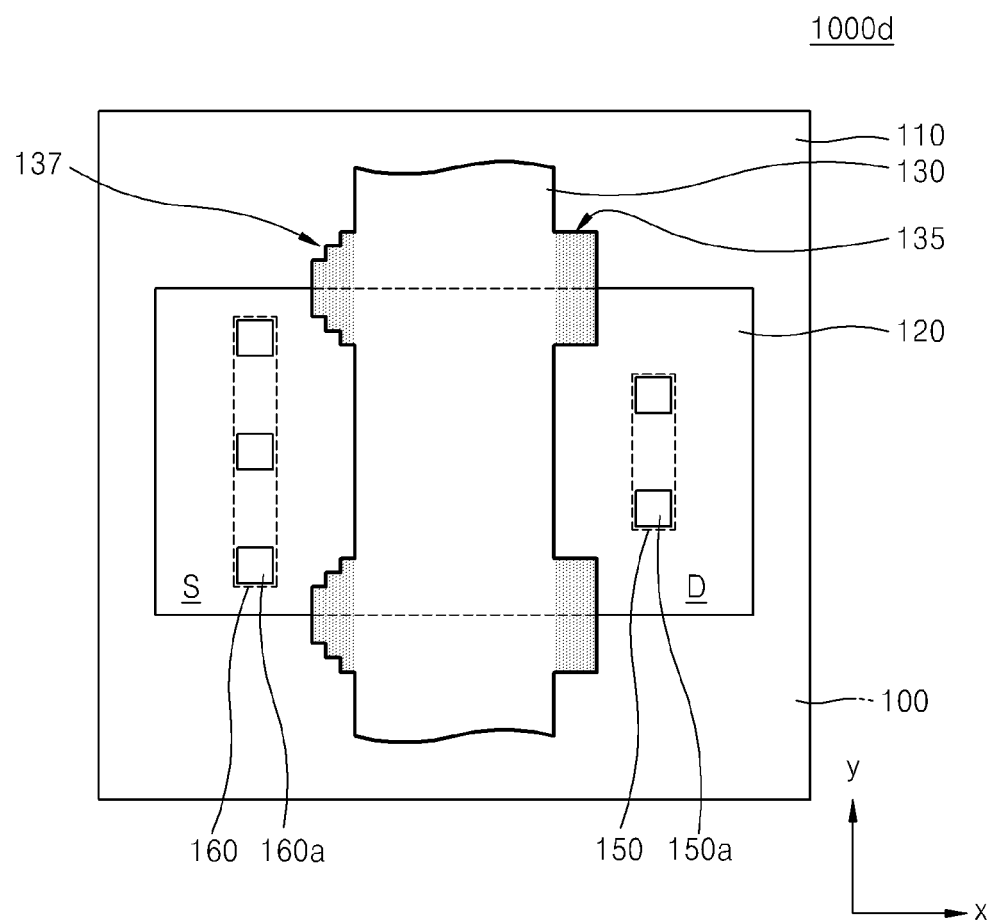

Other exemplary layouts of semiconductor devices according to the inventive concept are shown in FIGS. 2 to 4. Basically, only the features/aspects of the semiconductor devices 1000b which are different from those of the example of FIGS. 1A-1C will be described in detail.

The gate electrode 130 of the semiconductor device 1000b shown in FIG. 2 further includes a plurality of second gate tabs 137 (shaded in the figure) protruding toward second region S from the main linear section (left unshaded) over boundaries between the active region 120 and the device isolation structure 110, respectively. Each second gate tab 137 has a width that gradually decreases in a direction away from the main linear section. Furthermore, the longest portion of each second gate tab 137 lies directly above a respective one of the boundaries between the active region 120 and the device isolation structure. This allows the width W3 of the second contact plug 160 to be greater than the width W1 of first contact plug 150 by a predetermined amount W". Note, the second gate tabs 137 can have various forms by which their widths vary, including the stepped forms shown in the figure.

In addition, in the illustrated example, the lengths L1 of the second gate tabs 137 are the same as the lengths L2 of the first gate tabs 135. However, in another example of this embodiment, the lengths L1 of the second gate tabs 137 are less than the lengths L2 of the first gate tabs 135. In either case, the surface area of second gate tab 137 (which is the same as its cross-sectional area) is less than that of first gate tab 135.

In the semiconductor device 1000b of the current embodiment, the likelihood that HEIP will occur is not only reduced by the first gate tabs 135, but by the second gate tabs 137, as well. Also, the second gate tabs 137 of decreasing widths allow for a long second contact plug 160 to be provided on the second region S. Accordingly, the on-current may be maximal, thereby offering an enhancement in the performance of the semiconductor device 1000b.

In the example of the semiconductor device 1000c shown in FIG. 3, first contact plug 150 and second contact plug 160 comprise a plurality of first sub-contact plugs 150a and a plurality of second (discrete and spaced apart) sub-contact plugs 160a, respectively. In another example, only one of the first and second contact plugs 150 and 160 comprises a plurality of sub-contact plugs.

The sum of the surface (or cross-sectional) areas of the second sub-contact plugs 160a constituting the second contact plug 160 is greater than the sum of surface areas of the first sub-contact plugs 150a constituting the first contact plug 150. For example, the first sub-contact plugs 150a and the second sub-contact plugs 160a have the same surface areas, respectively, but the number of the second sub-contact plugs 160a is greater than the number of first sub-contact plugs 150a.

In the embodiment of the semiconductor device 1000c according to the inventive concept, the first gate tabs 135 reduce the likelihood that HEIP will occur. Also, sub-contact plugs are provided such that the contact plug on the second region S has a greater cross-section area than the contact plug on the first region D. Accordingly, the on-current may be maximal, thereby offering an enhancement in the performance of the semiconductor device 1000c.

Referring to FIG. 4, the gate electrode 130 of a semiconductor device 1000d further includes a plurality of second gate tabs 137 protruding toward a second region S. Also, first contact plug 150 and second contact plug 160 comprise a plurality of first sub-contact plugs 150a and a plurality of second sub-contact plugs 160a, respectively. Thus, this example combines the features and advantages of the examples of FIGS. 2 and 3 described above.

The semiconductor devices 1000a, 1000b, 1000c, and 1000d according to the inventive concept, as described above, are also useful as applied to N-channel metal oxide semiconductor (NMOS) transistors. So-called narrow width effects may be mitigated in the case of an NMOS transistor according to the inventive concept. Also, the amount of on-current may be maximized.

Figure 5:
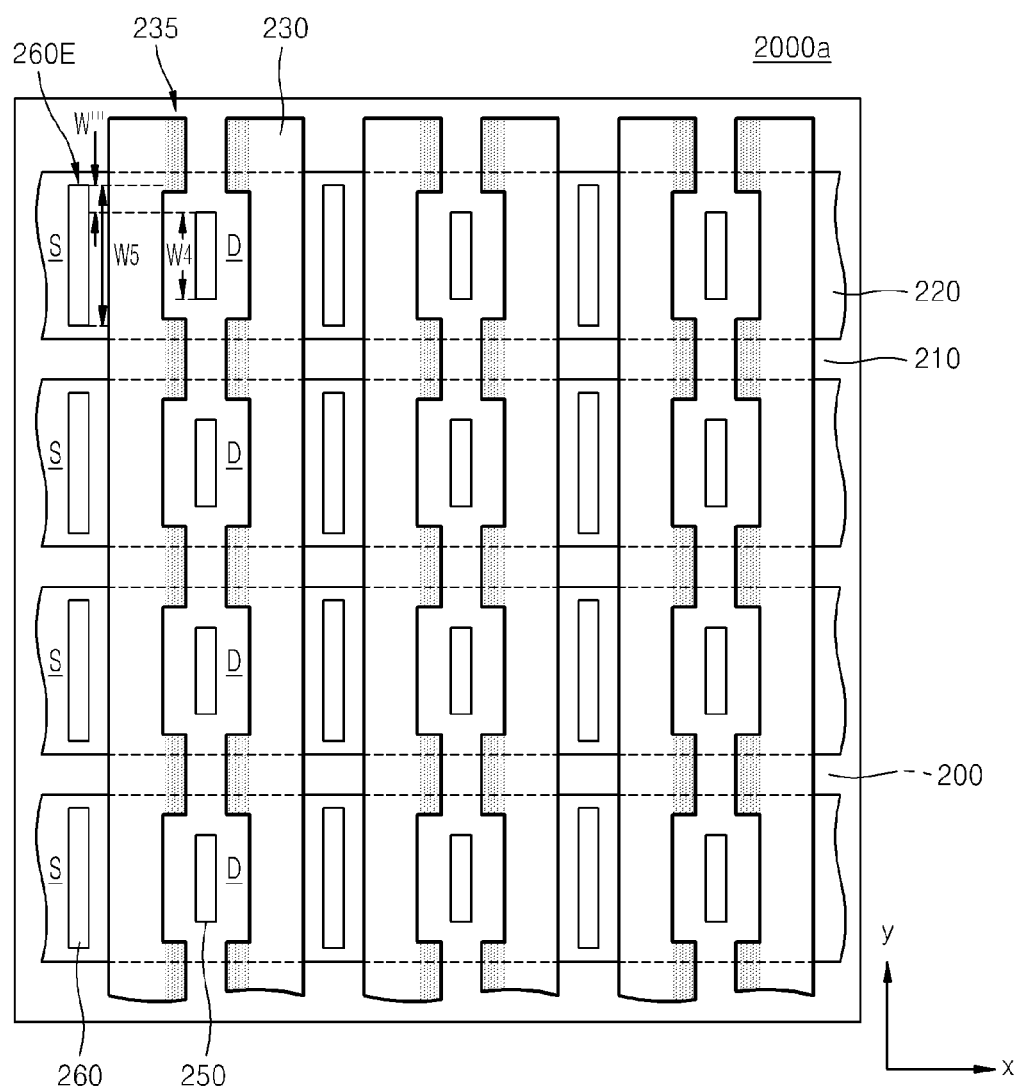
FIGS. 5 and 6 are schematic diagrams of still other examples, respectively, of layouts of a semiconductor device according to the inventive concept.
Figure 6:
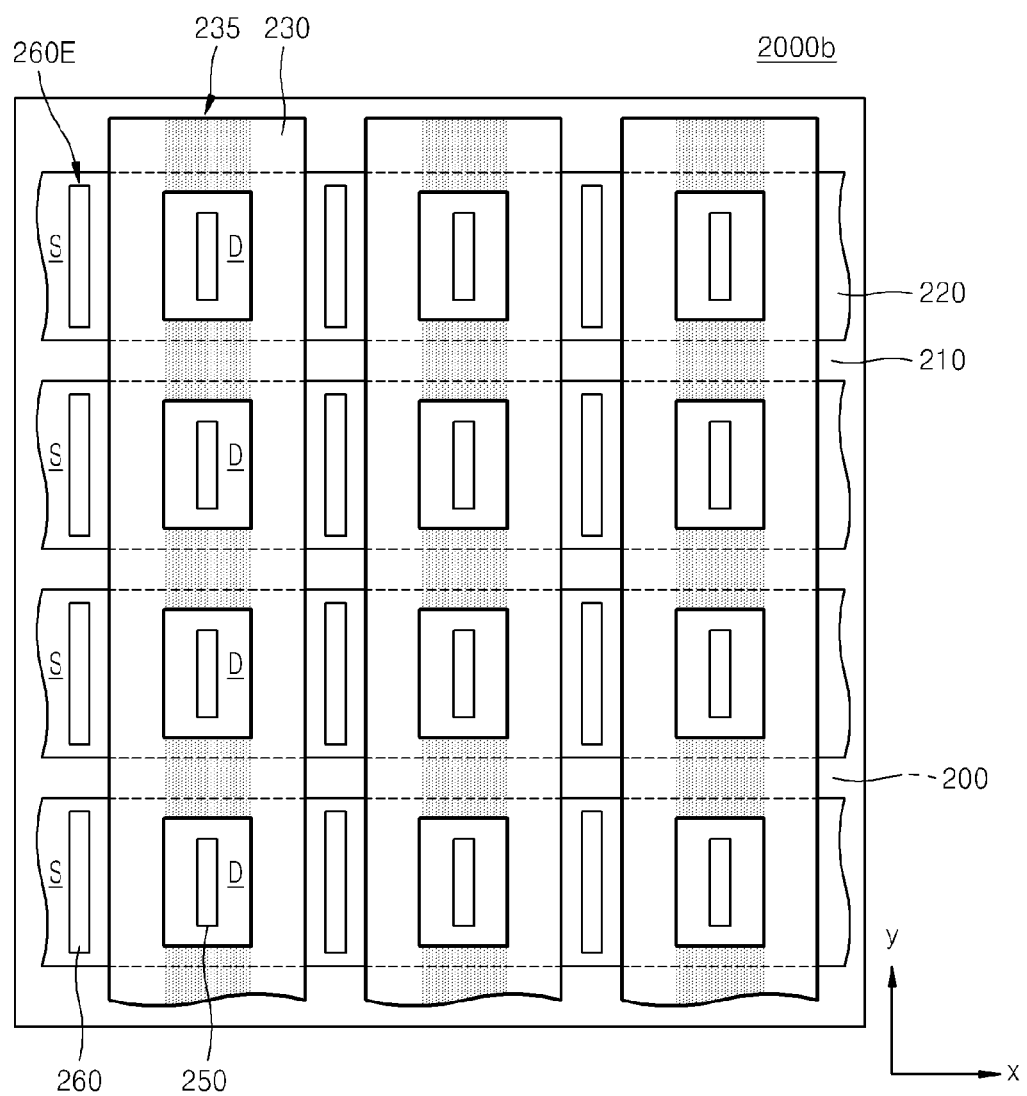

Larger scale layouts of other examples of semiconductor device 2000a, 2000b according to the inventive concept are shown in FIGS. 5 and 6, respectively. In the semiconductor devices of FIGS. 5 and 6, adjacent transistors share either a first region D or a second region S.

Referring to FIG. 5, the semiconductor device 2000a includes a substrate 200 having a plurality of elongated active regions 220 extending longitudinally in one direction, namely, the direction of the x-axis in the figure, a device isolation structure 210 disposed in the upper part of the substrate 200 and delimiting the active regions 220, and a plurality of gate electrodes 230 extending longitudinally in another direction, namely the direction of the y-axis in the figure. The gate electrodes 230 are disposed parallel to one another and span each of the active regions 220. Each of the active regions 220 has a plurality of first or drain regions D each located to one side of a respective gate electrode 230, and a plurality of second or source regions S each located to the other side of the gate electrode 230. The device isolation structure 210 is interposed between the active regions 220. More specifically, a respective section of device isolation structure 210 is interposed between the active regions 220 of each pair thereof adjacent one another in the direction of the y-axis.

The first contact plugs 250 and the second contact plugs 260 are disposed on the first regions D and on the second regions S, respectively. Also, in this respect, the first contact plugs 250 are arrayed in rows and columns, with each row extending along a respective active region 220 (i.e., in the direction of the x-axis) and each column extending across the active regions 220. Likewise, the second contact plugs 260 are arrayed in rows and columns, with each row extending along a respective active region 220 (i.e., in the direction of the x-axis) and each column extending across the active regions 220.

Also, each column of first contact plugs 250 is assymetrical with the adjacent column of second contact plugs 260 about an axis extending in the direction of the y-axis and located midway between the adjacent columns of first and second contact plugs 250 and 260.

The gate electrodes 230 each include a plurality of first gate tabs 235 (shaded in the figure) adjacent to the first region D and protruding in the direction of the x-axis by a predetermined amount. Furthermore, each first gate tab 235 may be disposed on a boundary between an active region 220 and the device isolation structure 210. Thus, each gate electrode 230 may be asymmetrical about an axis parallel to the y-axis. On the other hand, the first gate tabs 235 may be collectively symmetrical about an axis parallel to the y-axis direction and bisecting a column of the first contact plugs 250.

In another example of this embodiment, not all of the first contact plugs 250 of each set disposed between adjacent ones of the gate electrodes 230 are aligned in the direction of the y-axis. That is, the first contact plugs 250 that are disposed between adjacent ones of the gate electrodes 230 are respectively centered along two or more spaced apart axes parallel to the y-axis. In this case, the distance between the axes is such that wiring lines (not shown) formed directly over and electrically connected to the first contact plugs 250 will not contact each other.

In addition, the width W5 of the second contact plugs is greater than the width W4 of the first contact plugs 250. Also, one end 260E of the second contact plug 260 extends further toward an edge of the active region 220 than the corresponding end of the first contact plug 250 by a predetermined amount W'''. In this respect, the contact plugs 250 and 260 and gate electrode tabs 235 are configured similarly to the contact plugs 150 and 260 and gate electrode tabs 135 shown in and described with reference to FIG. 1A.

In the example of the semiconductor device 2000b shown in FIG. 6, the first gate tabs 235 of two adjacent gate electrodes 230, of each respective pair of gate electrodes 230, are adjoined along an axis parallel to the direction of the y-axis. The axis along which the first gate tabs 235 are adjoined may bisect a column of the first gate electrodes 250 interposed between the adjacent gate electrodes 230.

Thus, the adjacent gate electrodes 235 of each respective pair thereof are unitary and may be said to constitute a single electrode having a series of openings therethrough. First contact plugs 250 extend through the openings, respectively. Furthermore, as shown in the figure, the first contact plugs which extend through the series of openings in each electrode may be aligned in the direction of the y-axis, i.e., may be arranged in a column.

In the embodiments of semiconductor devices 2000a and 2000b according to the inventive concept, the first gate tabs 235 prevent electrons from being trapped in the device isolation structure 210 during an operation of the semiconductor device 2000a, thereby reducing the likelihood that HEIP will occur. Also, the second contact plugs 260 disposed on the second regions S may be sized to maximize the amount of on-current may be increased, thereby enhancing the performance of the semiconductor devices 2000a or 2000b.

Note, also, the embodiments of FIGS. 5 and 6 may also each employ the features of the examples shown in and described with reference to FIGS. 2 to 4, namely the second gate tabs 137 and/or the discontinuous contact plugs 150a and/or 160a.

A method of manufacturing a semiconductor device according to the inventive concept will now be described with reference to FIGS. 7A to 7C. As an example, the method will be described with reference to the manufacturing of the device shown in and described with reference to FIG. 1A.

Referring first to FIG. 7A, a mask (not shown) is formed on the substrate 100, and then a trench is formed in the substrate 100 by anisotropically etching the substrate 100 using the mask as an etch mask. The depth of the trench on the characteristics desired of the device to be manufactured. Also, the side walls of the trench may not be perpendicular to the upper surface of the substrate 100. For example, the width of the trench may decrease in the direction of the depth of the trench. After the trench is formed, an ion implantation process may be performed to reinforce insulating characteristics.

Next, the first insulating layer 112 is formed along the inside of the trench. The first insulating layer 112 may be a thermal oxide layer formed by a radical oxidation process using a furnace, or a rapid thermal annealing (RTA) process. Alternatively, the first insulating layer 112 may be formed by depositing an insulating material on the substrate 100.

Then, the trench liner 114 is formed on the first insulating layer 112. The trench liner 114 may comprise a nitride, and may be formed by low pressure chemical vapor deposition (LPCVD). In a DRAM device, a trench liner comprising a nitride layer is used to improve the refresh characteristic of the DRAM device. However, as a result of using a nitride layer as a trench liner in a DRAM device, electrons can be trapped in the trench liner and thereby give rise to HEIP.

Then, the second insulating layer 116 is formed on the trench liner 114. The second insulating layer 116 may comprise an oxide and may be formed by using a CVD process. An annealing process may be additionally performed, after the second insulating layer 116 is formed, for densifying the membrane of the resulting structure.

Then, a planarization process, such as a chemical mechanical polishing (CMP) process, is performed to complete the device isolation structure 110. The active region 120 of the substrate 100 is defined by the device isolation structure 110.

Next, the gate insulating layer 125 and the gate electrode 130 are formed on the substrate 100. The gate insulating layer 125 may be formed of silicon oxide ($SiO_2$), a dielectric material with a high dielectric constant (k), or a composite layer comprising silicon oxide ($SiO_2$) and silicon nitride (SiN). In this regard, a high-k dielectric refers to dielectric material having a dielectric constant higher than that of silicon oxide. The gate electrode 130 may be formed of polysilicon or a metal such as W. Also, the forming of the gate electrode 130 may include a silidization process in which a metal silicide is formed at an upper portion of a metal layer FIG. 7A shows a first step in the forming of the gate insulating layer 125 and the gate electrode 130 on the substrate 100. In particular, insulating material constituting the gate insulating layer is formed on the substrate 100 as a first layer, and then conductive material constituting the gate electrode is formed on the insulating material as a second layer. In this respect, for ease of understanding, reference numerals 125 and 130 are used in the figure to denote the first and second layers from which the gate insulating layer and the gate electrode are formed on the substrate 100.

Figure 7B:
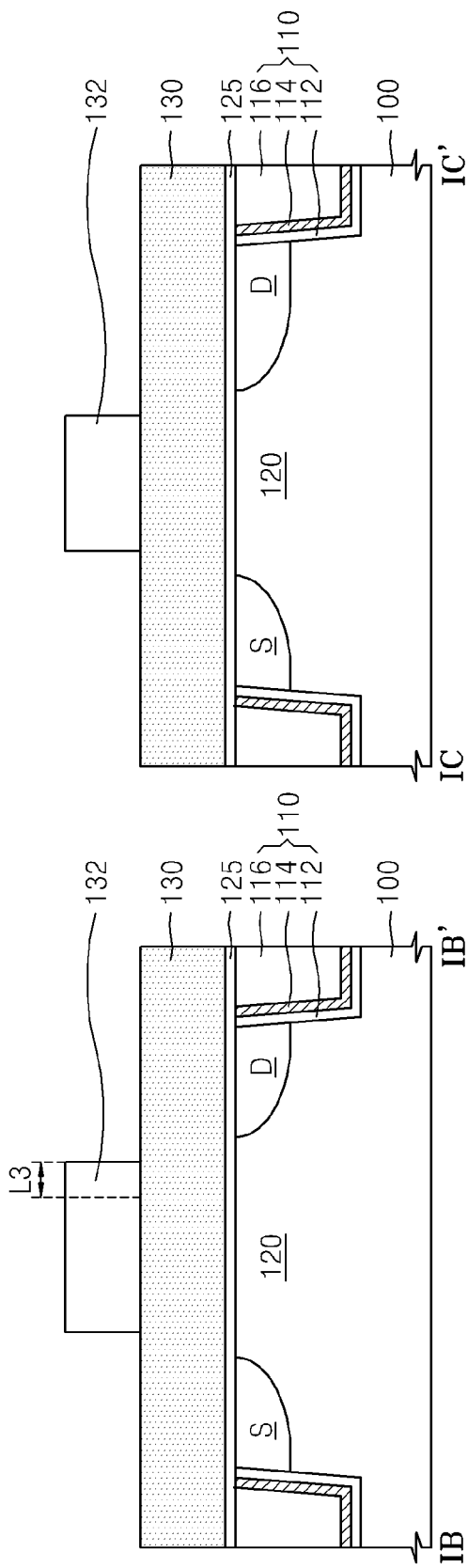

Next, as shown in FIG. 7B, a photoresist pattern 132 is formed on the second layer 130. The photoresist pattern 132 has tabs itself of predetermined lengths L3 along respective portions thereof, corresponding to the first tabs 135 to be formed.

Figure 7C:
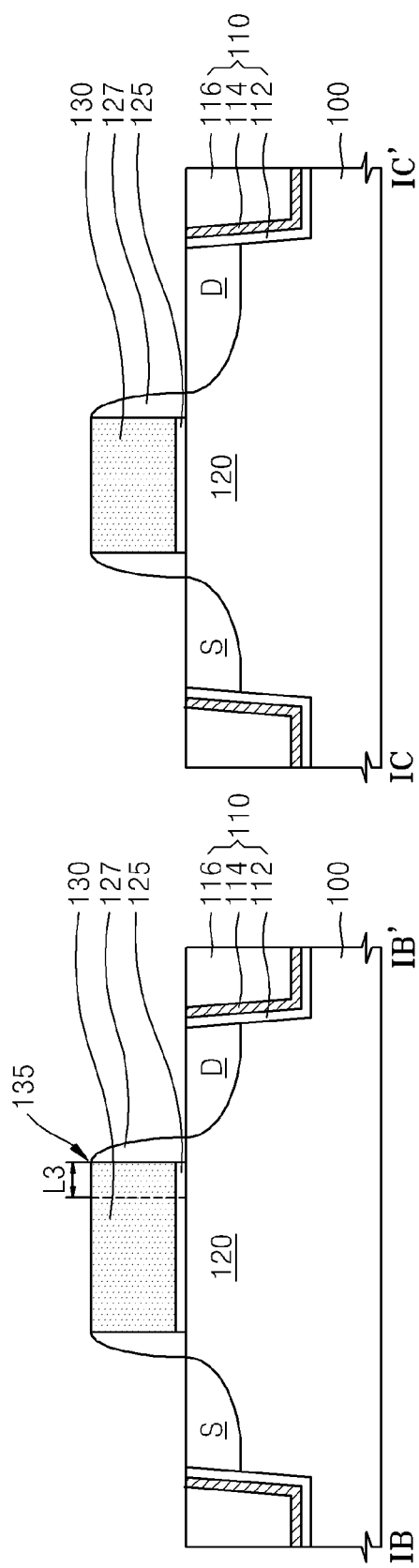

Referring to FIG. 7C, the first (insulating) layer 125 and the second (conductive) layer 130 are patterned using the photoresist pattern 132 as a mask. In particular, those portions of the second (conductive) layer 130 and first (insulating) layer 125 exposed by the photoresist pattern 132 are etched away using the photoresist pattern 132 as an etch mask, thereby forming the gate insulating layer 125, and gate electrode having a main linear section and first gate tabs 135 protruding by a distance L3 from the main linear section. Subsequently, spacers 127 of insulating material may be respectively formed on sidewall surfaces of the gate electrode 130.

The first gate tabs 135 may be formed to each span a section of the trench liner 114 on the substrate 100 (in the direction of the y-axis of FIG. 1A) as well as a boundary between the active region 120 and the device isolation structure 110.

Next, the first region D and the second region S are formed by implanting impurities into the substrate 100. In this process, the gate electrode 130 and sidewall spacers 127 may serve as a mask. Also, the impurities may be implanted by injecting ions into the exposed surface of the substrate 100 at a predetermined angle of less than 90 degrees relative to the upper surface of the substrate 100.

Then, referring to FIGS. 1B and 1C, the interlayer insulating layer 140 is formed on the substrate 100 over the entire upper surface thereof. Next, portions of the interlayer insulating layer 140 aligned with the first region D and the second region S are etched away to form contact holes, and the contact holes are filled with conductive material to form the first contact plug 150 and the second contact plug 160.

An off-current characteristic of a semiconductor device according to the inventive concept will be described with respect to the graph of FIG. 8.

Figure 8:
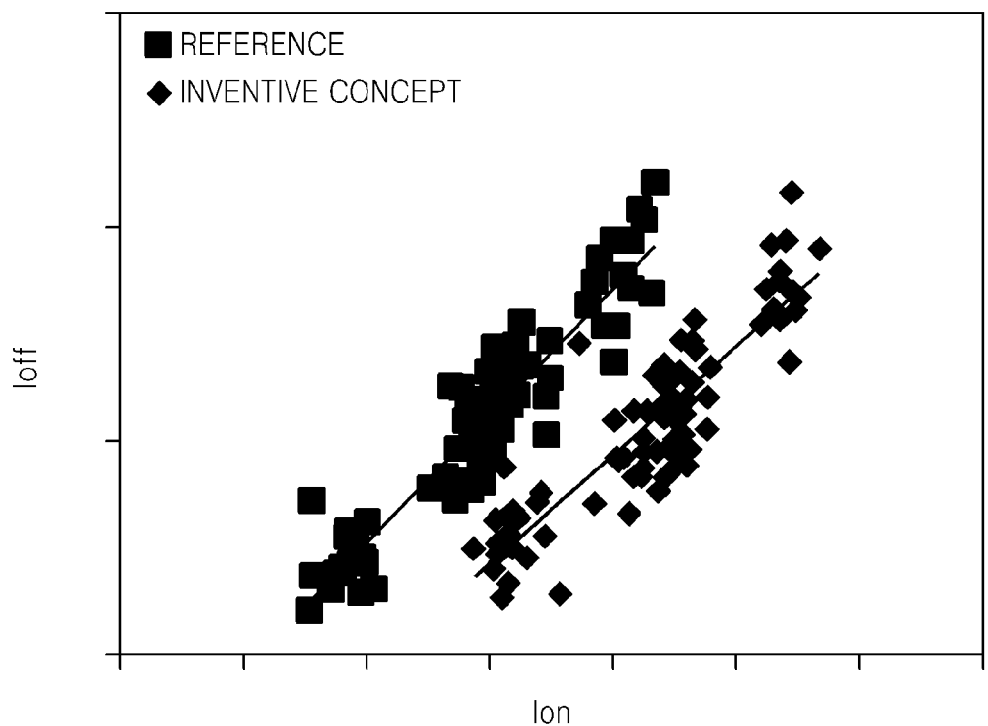
FIG. 8 is a graph of an off-current characteristic of a semiconductor device according to the inventive concept.

The plots in the graph of FIG. 8 were obtained by measuring an off-current $I_{off}$ and an on-current $I_{on}$ of a reference transistor and a transistor according to the inventive concept, and plotting values to the measurements of the off-current $I_{off}$ and the on-current $I_{on}$ in arbitrary units along the y-axis and x-axis, respectively. The transistor according to the inventive concept was of the type shown in and described with reference to FIG. 1A. The reference transistor was similar to that illustrated in FIG. 1A but included another set of the first gate tabs 135 protruding toward the second region S, and first and second contact plugs of the same widths (W1) over the first and second regions D and S, respectively.

The graph of FIG. 8 shows that the transistor according to the inventive concept exhibits a greater on-current $I_{on}$ for the same off-current $I_{off}$ compared to the reference transistor. In fact, the on-current $I_{on}$ was greater by about 7.6%.

Also, although not shown, the HEIP characteristic of the transistor according to the inventive concept was similar to that of the reference transistor. That is, even though the transistor according to the inventive concept has a HEIP characteristic similar to that of a transistor in which gate tabs are formed on both a source region and a drain region, the transistor according to the inventive concept is advantageous over such a reference transistor in terms of its on-current $I_{on}$ characteristic.

Figure 9:
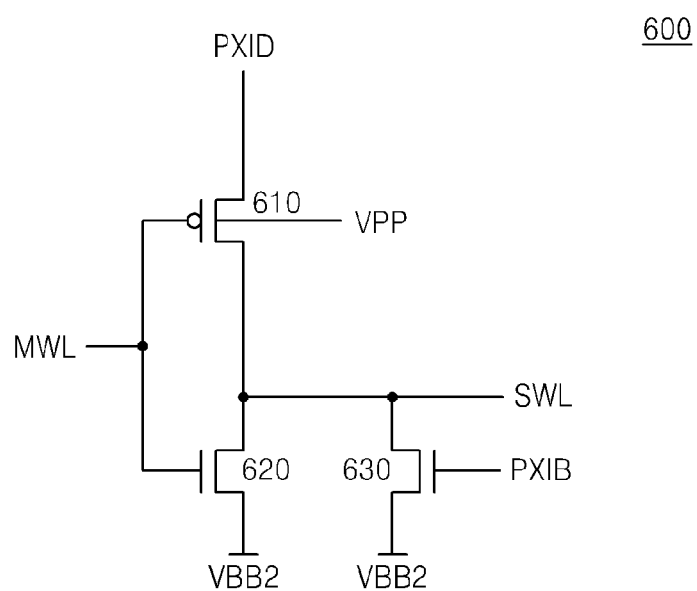
FIG. 9 is a circuit diagram of a sub-word line driving circuit including a semiconductor device.

FIG. 9 is a circuit diagram showing a sub-word line driving circuit 600 including at least one semiconductor device according to the inventive concept.

Referring to FIG. 9, the sub-word line driving circuit 600 of a memory semiconductor device includes a p-type metal-oxide semiconductor (PMOS) transistor 610 whose source region (electrode) is connected to a source terminal receiving unit (PXID) and whose drain region (electrode) is connected to a sub-word line SWL, a first NMOS transistor 620 connected between the sub-word line SWL and a ground voltage terminal VBB2, and a second NMOS transistor 630 connected between the sub-word line SWL and the ground voltage terminal VBB2. The sub-word line driving circuit 600 also includes a main word line driving signal MWL that controls PMOS transistor 610 and first NMOS transistor 620, and a reverse sub-word line selection signal PXIB that controls the second NMOS transistor 630.

More specifically, the sub-word line driving circuit 600 drives the sub-word line SWL in response to the main word line driving signal MWL. First, if both the main word line driving signal MWL and the sub-word line selection signal FXID are activated at a logic low level, the PMOS transistor 610 is turned on to drive the sub-word line SWL with a boosted voltage VPP. Although not shown in the drawings, a plurality of memory cells are connected to the sub-word line SWL, and the plurality of memory cells are activated when the current (signal) through the sub-word line SWL is at a certain driving level.

Next, if both the main word line driving signal MWL and the sub-word line selection signal FXID are at a logic high level, the first NMOS transistor 620 is turned on to drive the sub-word line SWL with the ground voltage VBB2. The boosted voltage VPP as a substrate bias voltage is applied to the PMOS transistor 610 controlled by the main word line driving signal MWL. Accordingly, when the main word line driving signal MWL is driven at a logic high level, that is, with the boosted voltage VPP, the PMOS transistor 610 is turned off.

The PMOS transistor 610 in the circuit 600 is a semiconductor device according to the inventive concept (i.e., may have the form of any of the examples described above). Accordingly, even under a high level boosted voltage VPP, HEIP is prevented to ensure that reliability of the circuit.

Figure 10:
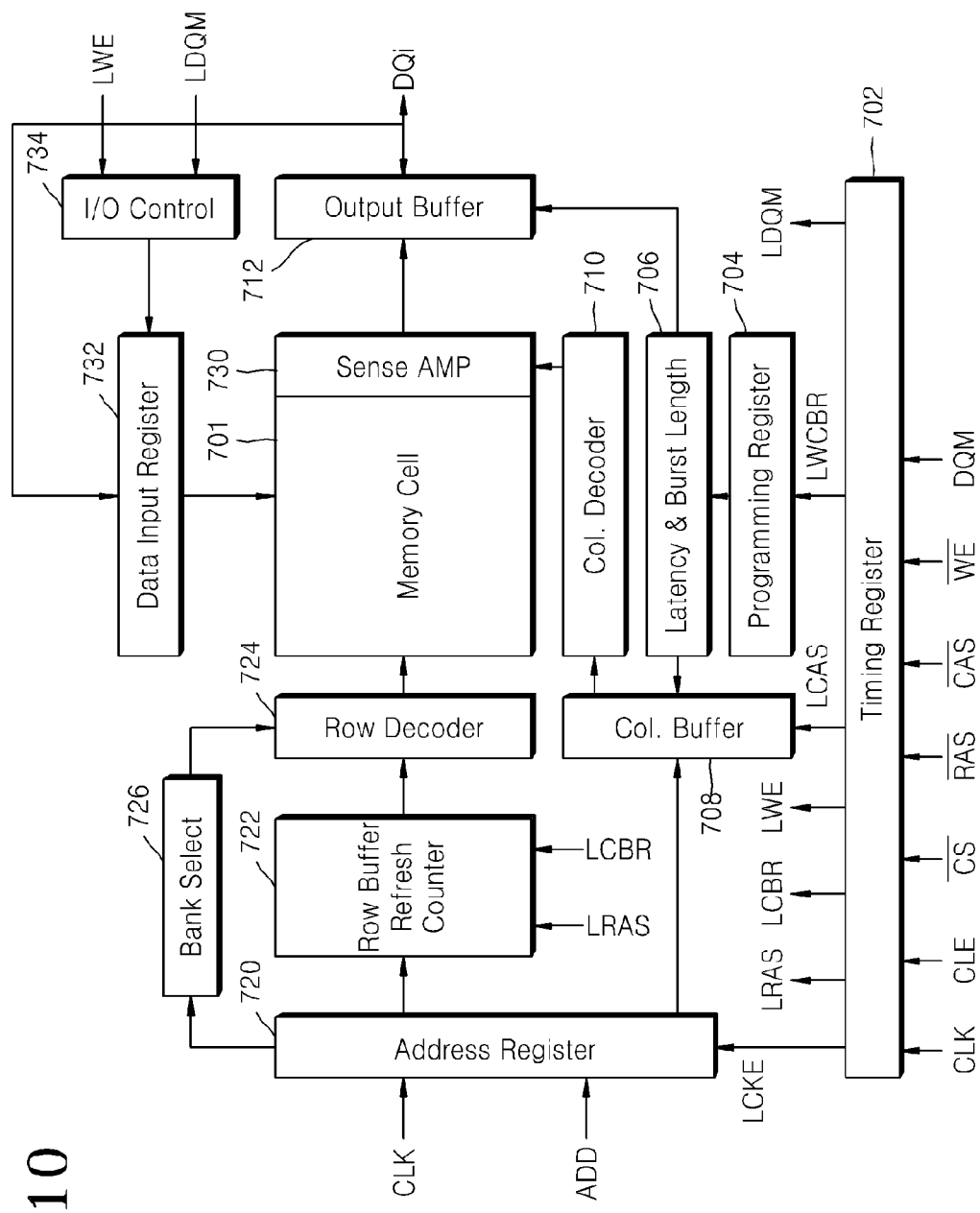
FIG. 10 is a block of a semiconductor memory device in which the sub-word line driving circuit of FIG. 9 is employed.

FIG. 10 shows an example of a memory 700 including at least one sub-word line driving circuit of the type shown in FIG. 9, i.e., having a semiconductor device according to the inventive concept.

The memory 700 of this example includes a memory cell array 701, which includes a DRAM cell, and various circuit blocks for driving the DRAM cell. For example, a timing register 702 may be activated when a chip selection signal CS is changed from an inactivation level, e.g. a logic high level, to an activation level, e.g. a logic low level. The timing register 702 may receive command signals, such as a clock signal CLK, a clock enable signal CKE, a chip selection signal CSB, a row address strobe signal RASB, a column address strobe signal CASB, a write enable signal WEB, a data input/output mask signal DQM and the like, and may generate various internal command signals, such as an LRAS, an LCBR, an LWE, an LCAS, an LWCBR, and an LDQM, for controlling circuit blocks by processing the received command signals.

Some of the internal command signals generated by the timing register 702 are stored in a programming register 704. For example, latency information or burst length information associated with output of data may be stored in the programming register 704. The internal command signals stored in the programming register 704 are issued to a latency/burst length control unit 706, and the latency/burst length control unit 706 provides a control signal for controlling latency of data output or a burst length to a column decoder 710 or an output buffer 712 via a column address buffer 708.

An address register 720 receives an address signal ADD from an external device. A row address signal is provided to a row decoder 724 via a row address buffer 722, and a column address signal is provided to the column decoder 710 via the column address buffer 708. The row address buffer 722 may further receive a refresh address signal generated by a refresh counter in response to refresh commands LRAS and LCBR and provide any one of the row address signal and the refresh address signal to the row decoder 724. Also, the address register 720 may provide a bank signal for selecting a bank to a bank selection unit 726.

The row decoder 724 decodes the row address signal or the refresh address signal that is input from the row address buffer 722 and activates a word line of the memory cell array 701.

A plurality of the sub-word line driving circuits each including a semiconductor device according to the inventive concept may be arranged in blocks at predetermined intervals in the memory cell array 701. Alternatively, one such sub-word line driving circuit may be disposed at an end of the memory cell array 701 so as to be perpendicular to a sensing amplifier 730.

The column decoder 710 decodes the column address signal and performs a selection operation with respect to a bit line of the memory cell array 701. For example, a column selection line is used in the memory 700 to perform a selection operation through the column selection line.

The sensing amplifier 730 amplifies data of a memory cell selected by the row decoder 724 and the column decoder 710 and provides the amplified data to the output buffer 712. Data for recording in a data cell may be provided to the memory cell array 701 via a data input register 732, and an input/output controller 734 may control a data transmission operation through the data input register 732.

Finally, the inventive concept and examples thereof have been described above in detail. The inventive concept may, however, be embodied in many different forms and should not be construed as being limited to the examples described above. Rather, these embodiments and examples were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device comprising:
    a substrate, and a device isolation layer of electrically insulating material disposed in a portion of the substrate and delimiting a plurality of active regions of the substrate; and
    a plurality of gate electrodes disposed parallel to each other and each having a main section and first gate tabs,
    the main sections of each of the gate electrodes extending in the first direction across all of the active regions such that each of the active regions has a plurality of first sections on top of each of which at least one of the first gate tabs extends and a plurality of second sections,
    wherein the active regions are disposed parallel to each other and each of the active regions is elongated in the second direction,
    each of the first sections constitutes a drain region and each of the second sections constitutes a source region, and
    the gate electrodes constitute transistors of the device, and adjacent ones of the transistors are constituted by a common one of the first sections of the active region.

2. The semiconductor device of claim 1, wherein the first gate tabs of one of each respective pair of the gate electrodes respectively adjoin the first gate tabs of the other of the gate electrodes of the respective pair.

3. A semiconductor device comprising:
    a substrate, and a device isolation layer of electrically insulating material disposed in a portion of the substrate and delimiting a plurality of active regions of the substrate;
    a gate electrode having a main section extending across the active regions in a first direction such that a first section of each of the active regions lies to one side of the main section of the gate electrode and a second section of each of the active regions lies to the other side of the main section of the gate electrode, and at least one respective first gate tab protruding from the main section towards the first section of each of the active regions in a second direction, different from the first direction,
    a respective first electrically conductive contact plug disposed on each of the first sections of the active regions; and
    a respective second electrically conductive contact plug disposed on each of the second sections of the active regions, and
    wherein the gate electrode is asymmetrical about an axis extending in the first direction and bisecting the main section of the gate electrode, and
    the first gate tabs are spaced in the first direction relative to the first contact plugs
    wherein each of the first gate tabs covers a respective boundary between one of the active regions and the device isolation layer,
    wherein the gate electrode has two respective first gate tabs disposed over boundaries between each of the active regions and the device isolation layer,
    wherein the first section of the active region and the second section of each of the active regions are a drain region and a source region, respectively, and
    wherein the first contact plug spans a first width of the active region in the first direction, the second contact plug spans a second width of the second section of the active region in the first direction, and the second width is greater than the first width.

4. The semiconductor device of claim 3, wherein at least part of one end of the second contact plug is juxtaposed in the second direction with at least part of the first gate tab.

5. The semiconductor device of claim 4, wherein two of the first gate tabs are respectively disposed over boundaries between each of the active regions and the device isolation layer, and the first contact is interposed between regions occupied by projecting the two first gate tabs in the second direction.

6. The semiconductor device of claim 3, wherein at least one of the first contact plug and the second contact plug is discontinuous so as to comprise a plurality of sub-contact plugs spaced from each other in the first direction.

* * * * *